(12) United States Patent
Takahashi et al.

(10) Patent No.: US 8,695,815 B2
(45) Date of Patent: Apr. 15, 2014

(54) HOUSING FRAME OF ELECTRICAL APPARATUS

(75) Inventors: Takehiro Takahashi, Tokyo (JP); Yousuke Yamada, Tokyo (JP)

(73) Assignee: Toshiba Mitsubishi-Electric Industrial Systems Corporation, Tokyo (JP)

( * ) Notice: Subject to any disclaimer, the term of this patent is extended or adjusted under 35 U.S.C. 154(b) by 287 days.

(21) Appl. No.: 12/883,836

(22) Filed: Sep. 16, 2010

(65) Prior Publication Data

US 2011/0074258 A1 Mar. 31, 2011

(30) Foreign Application Priority Data

Sep. 25, 2009 (JP) ................................. 2009-219981

(51) Int. Cl.
*A47F 5/14* (2006.01)
*B25G 3/00* (2006.01)

(52) U.S. Cl.
USPC .......................................... 211/182; 403/231

(58) Field of Classification Search
USPC ............................ 211/189, 182, 191, 192, 26; 312/265.1–265.4, 223.1; 52/653.1, 52/655.1; 403/231, 245, 246, 263
See application file for complete search history.

(56) References Cited

U.S. PATENT DOCUMENTS

| | | | | |
|---|---|---|---|---|
| 1,648,706 A | * | 11/1927 | Walker | 52/750 |
| 2,345,650 A | * | 4/1944 | Attwood | 403/21 |
| 2,784,812 A | * | 3/1957 | Kindorf | 403/22 |
| 3,229,790 A | * | 1/1966 | Irwin | 403/172 |
| 3,339,750 A | * | 9/1967 | Nelson-Hawkins | 211/191 |
| 3,353,854 A | * | 11/1967 | Hansen | 403/171 |
| 3,875,712 A | * | 4/1975 | Thompson | 52/263 |
| 3,919,603 A | * | 11/1975 | Salvati et al. | 361/605 |
| 4,342,397 A | * | 8/1982 | Halstrick | 211/191 |
| 4,347,015 A | * | 8/1982 | Olashaw | 403/219 |
| 4,464,074 A | * | 8/1984 | Green et al. | 403/192 |
| 4,545,490 A | * | 10/1985 | Hsiao et al. | 211/191 |
| 4,753,354 A | * | 6/1988 | Patterson et al. | 211/26 |

(Continued)

FOREIGN PATENT DOCUMENTS

| | | |
|---|---|---|
| JP | 60-4247 | 1/1985 |
| JP | 7-67219 | 3/1995 |

(Continued)

OTHER PUBLICATIONS

Office Action issued by the Japanese Patent Office on Oct. 29, 2013, for Japanese Patent Application No. 2009-219981, and Partial English Translation of Office Action.

*Primary Examiner* — Joshua Rodden
*Assistant Examiner* — Patrick Hawn
(74) *Attorney, Agent, or Firm* — Finnegan, Henderson, Farabow, Garrett & Dunner, L.L.P.

(57) ABSTRACT

A housing frame includes a first and second beams connected to each other through a connection member. The two beams are each obtained by perpendicularly bending a metal plate twice in the longitudinal direction. The second beam is arranged perpendicular to the first beam. The connection member has a connection base portion extending from a bent side surface of a second base portion to a bent side surface of a first base portion through a cut portion formed in a first side portion and overlaps with the first base portion and the second base portion. The connection base portion and the first base portion are fastened together by a first fastening member, and the connection base portion and the second base portion are fastened together by a second fastening member.

5 Claims, 11 Drawing Sheets

(56) References Cited

U.S. PATENT DOCUMENTS

| | | | |
|---|---|---|---|
| 4,869,380 A * | 9/1989 | Metcalfe et al. | 211/189 |
| 5,411,154 A * | 5/1995 | Vargo | 211/189 |
| 5,692,353 A * | 12/1997 | Bass et al. | 52/653.1 |
| 6,019,446 A * | 2/2000 | Laboch et al. | 312/265.1 |
| 6,070,957 A * | 6/2000 | Zachrai | 312/334.4 |
| 6,190,081 B1 * | 2/2001 | Besserer et al. | 403/231 |
| 7,762,038 B2 * | 7/2010 | Ceba et al. | 52/653.1 |
| 2002/0046979 A1 * | 4/2002 | Larsen et al. | 211/26 |
| 2006/0037273 A1 * | 2/2006 | Hashimoto et al. | 52/633 |
| 2009/0107078 A1 * | 4/2009 | Berridge | 52/653.1 |

FOREIGN PATENT DOCUMENTS

| | | |
|---|---|---|
| JP | 2004-31969 | 1/2004 |
| JP | 2005-56882 | 3/2005 |
| JP | 2008-84981 | 4/2008 |

* cited by examiner

HOUSING FRAME OF ELECTRICAL APPARATUS

CROSS REFERENCES TO RELATED APPLICATIONS

This application is based upon and claims the benefits of priority from the prior Japanese Patent Applications No. 2009-219981, filed in the Japanese Patent Office on Sep. 25, 2005, the entire content of which is incorporated herein by reference.

BACKGROUND OF THE INVENTION

1. Field of the Invention

The present invention relates to a housing frame of an electrical apparatus.

2. Description of the Related Art

A large-sized electrical apparatus, such as a power converter, houses semiconductor devices, capacitors, connection conductors, and so on inside the housing. The housing is constituted by a frame including a plurality of beams and an outer wall consisting of a plurality of panels (refer to, e.g., Patent Document 1: Jpn. Pat. Appln. Laid-Open Publication No. 2008-84981, the entire content of which is incorporated by reference). Typically, the beam is formed of an equal angle steel (or an equal angle bar), a steel bar having an L-shaped cross section. The frame is formed by welding a plurality of equal angle steels.

The equal angle steel used to constitute the abovementioned conventional housing frame is standardized in terms of the dimension, shape, and the like. Thus, in order to obtain a housing frame of an electrical apparatus having an arbitrary dimension and shape, large amount of cost and effort are required. Further, since the conventional housing frame is formed by welding a plurality of equal angle steel, higher level of skill is required for an operator in order to obtain a housing frame having a high dimensional accuracy.

SUMMARY OF THE INVENTION

The present invention has been made to solve the above problem, and an object thereof is to obtain a housing frame of an electrical apparatus having an arbitrary dimension and shape at low cost.

To achieve the above object, according to the present invention, there is provided a housing frame of an electrical apparatus having two or more beams connected to each other, wherein each of the two or more beams is formed by bending a rectangular metal plate once or twice in a longitudinal direction and includes a flat base portion and one or two flat side portions.

According to the present invention, it is possible to obtain a housing frame of an electrical apparatus having an arbitrary dimension and shape at low cost.

BRIEF DESCRIPTION OF THE DRAWINGS

The above and other features and advantages of the present invention will become apparent from the discussion hereinbelow of specific, illustrative embodiments thereof presented in conjunction with the accompanying drawings, in which.

DETAILED DESCRIPTION OF THE PREFERRED EMBODIMENTS

First Embodiment

A housing frame of an electrical apparatus according to a first embodiment of the present invention will be described.

Figure 1:
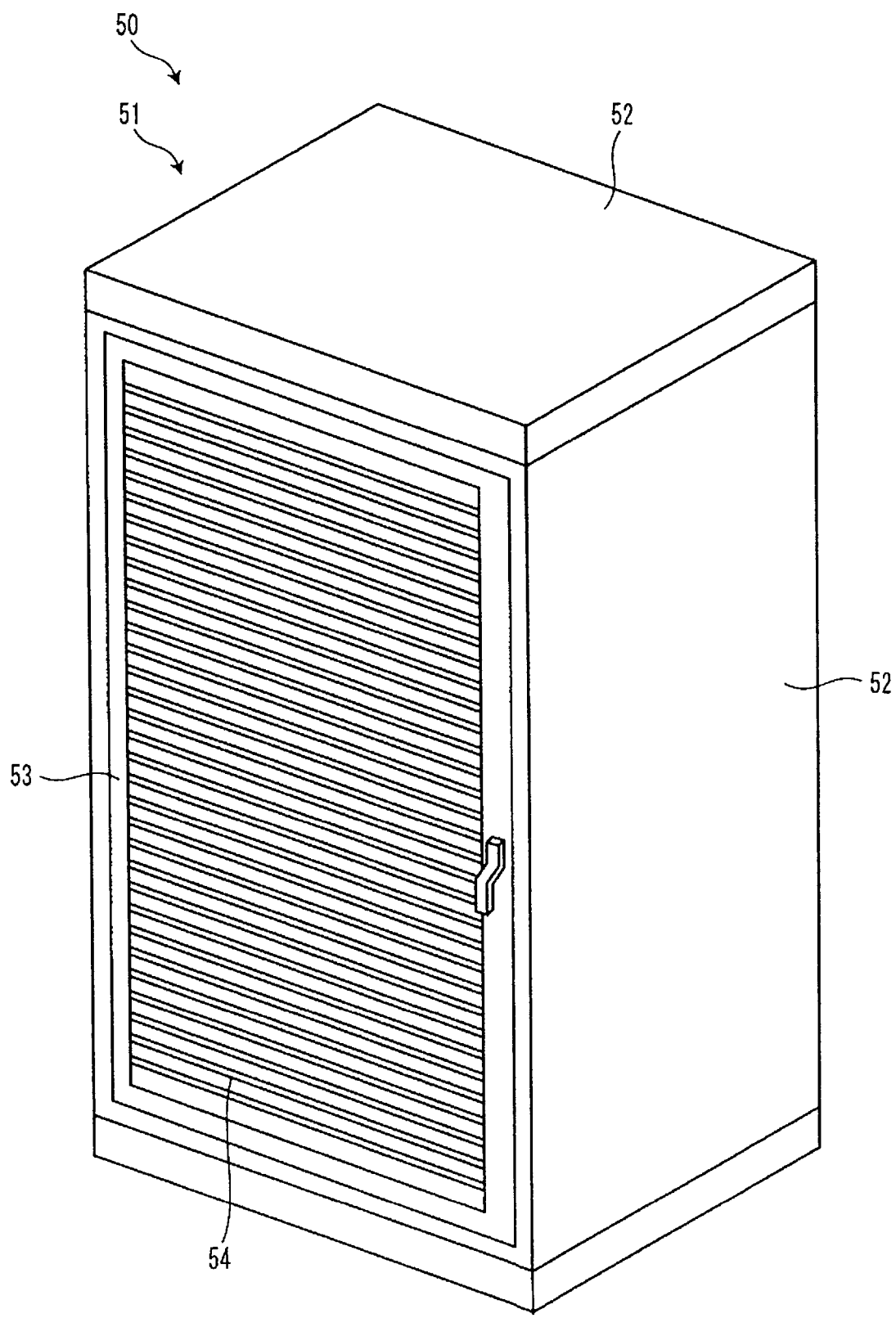
FIG. 1 is a perspective view of an electrical apparatus using a housing frame according to a first embodiment of the present invention.
Figure 2:
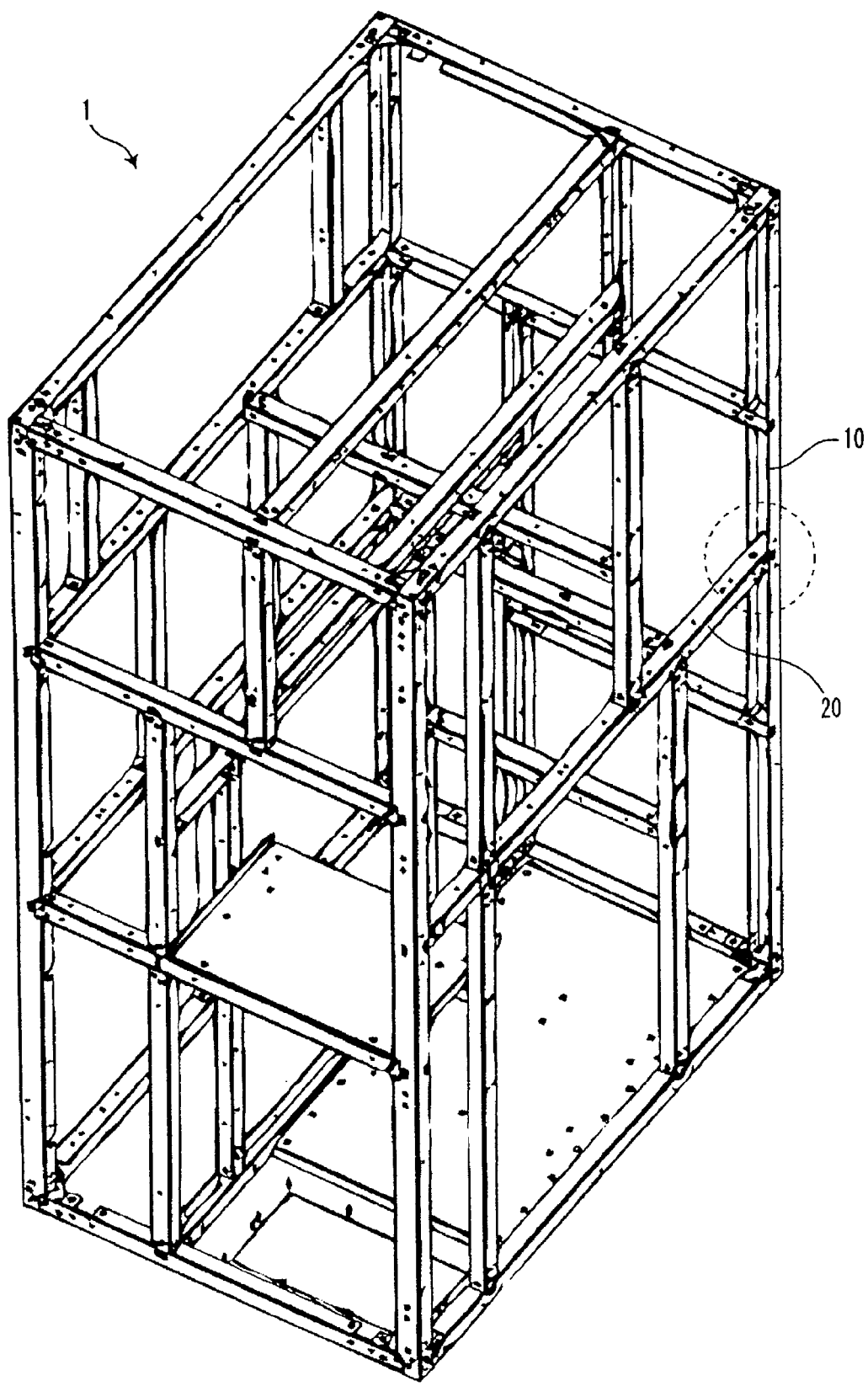
FIG. 2 is a perspective view of the housing frame of the electrical apparatus according to the first embodiment of the present invention.

The outline of a housing according to the first embodiment will be described with reference to FIGS. 1 and 2. FIG. 1 is a perspective view of an electrical apparatus using a housing frame. FIG. 2 is a perspective view of the housing frame.

An electrical apparatus 50 using a housing frame 1 of the present embodiment is, e.g., a power converter. Semiconductor devices, capacitors, connection conductors, and so on (which are not illustrated) are housed inside a housing 51 of the electrical apparatus 50.

The housing 51 has, e.g., a rectangular solid shape. The structure of the housing 51 is formed by a housing frame 1. The outer wall of the housing 51 consists of panels 52. A door 53 is provided in front of the housing 51. The door 53 has, e.g., a plurality of ventilation slits 54 in order to suppress rise in temperature inside the housing 51.

Figure 3:
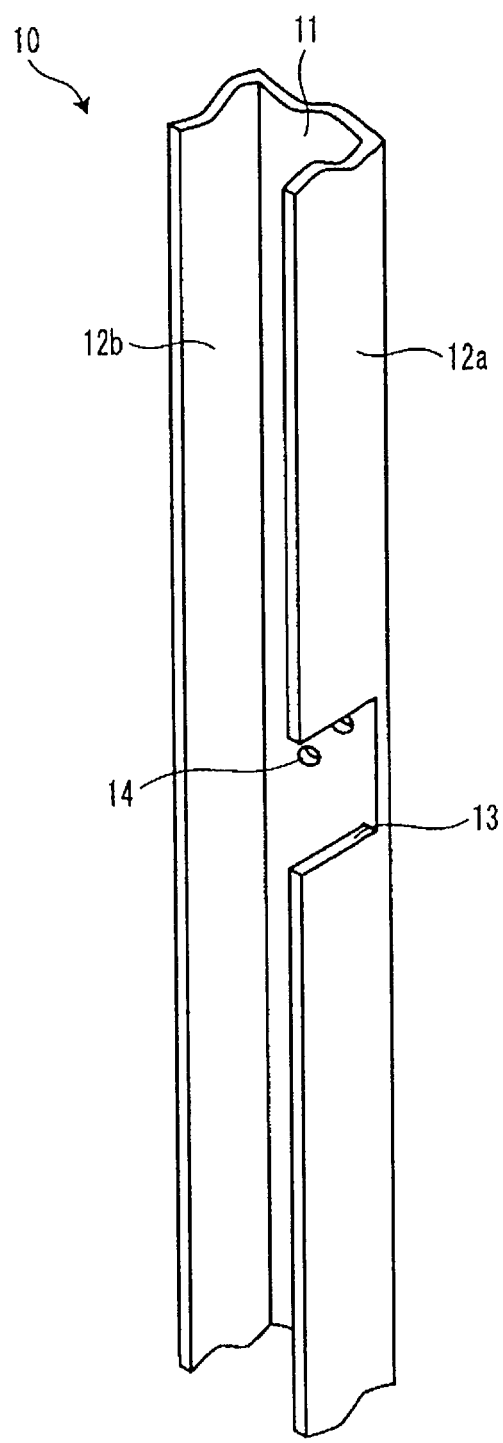
FIG. 3 is a perspective view of a first beam constituting the housing frame of the electrical apparatus according to the first embodiment of the present invention.
Figure 4:
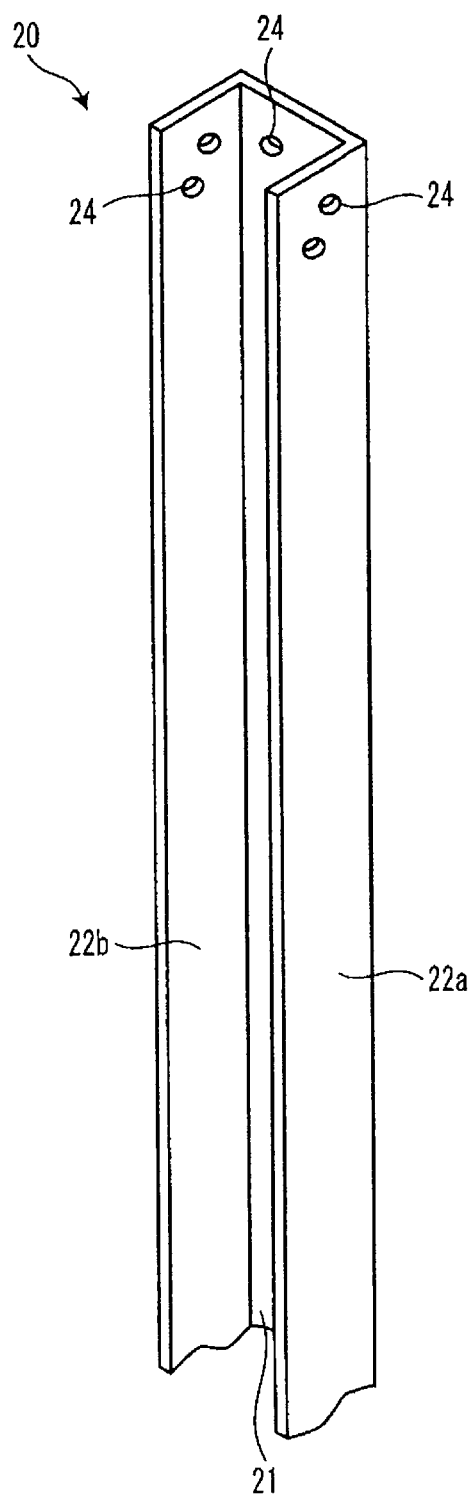
FIG. 4 is a perspective view of a second beam constituting the housing frame of the electrical apparatus according to the first embodiment of the present invention.
Figure 5:
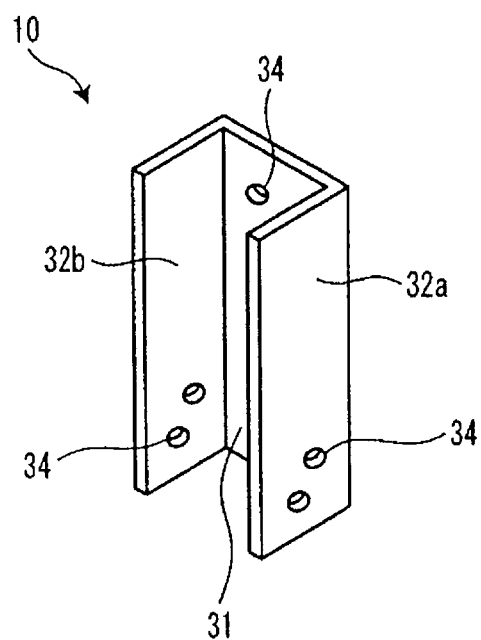
FIG. 5 is a perspective view of a connection member constituting the housing frame of the electrical apparatus according to the first embodiment of the present invention.
Figure 6:
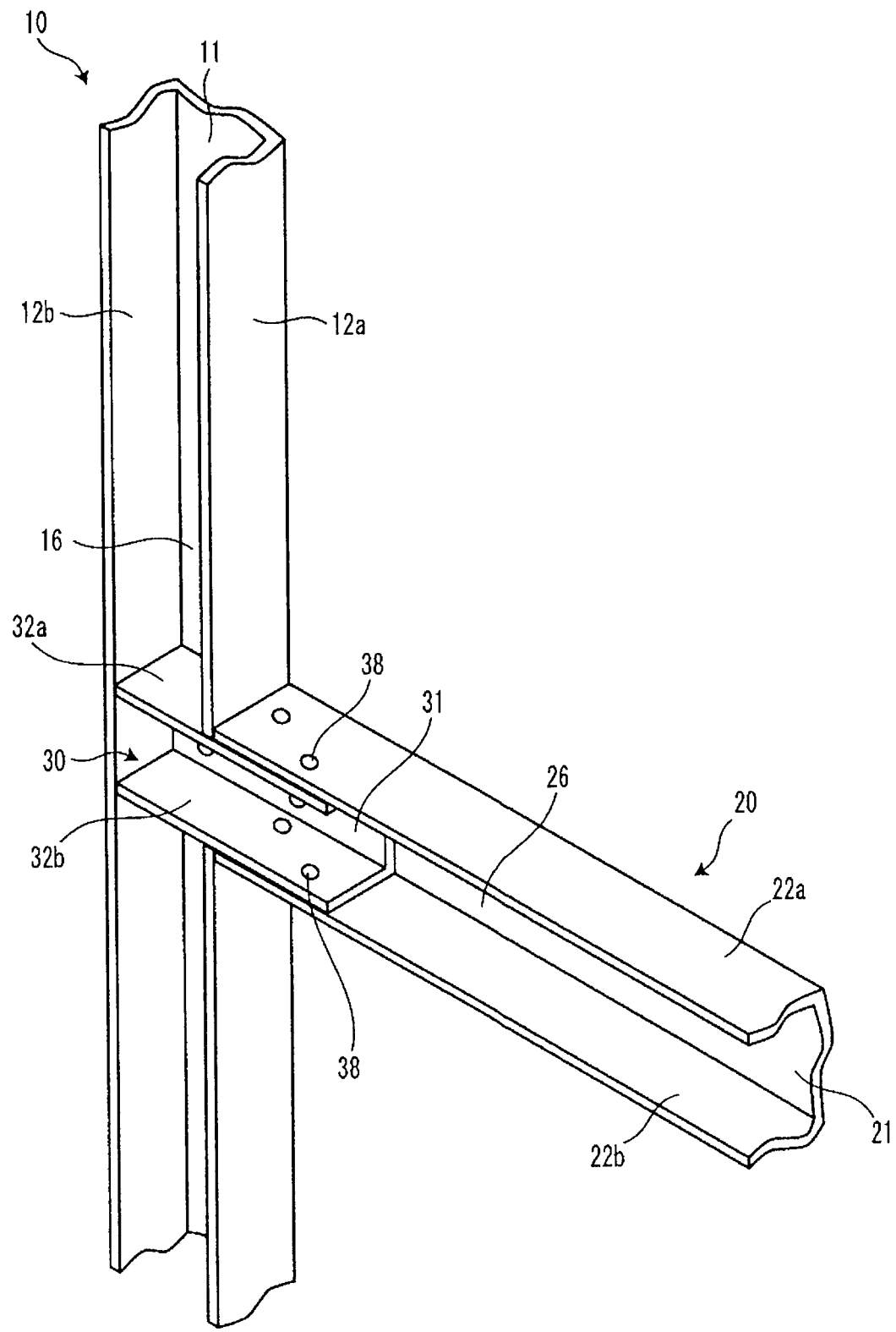
FIG. 6 is an enlarged perspective view of a part surrounded by a broken line of FIG. 2, illustrating a connection part between the first beam and the second beam as viewed from the inside of the housing frame.
Figure 7:
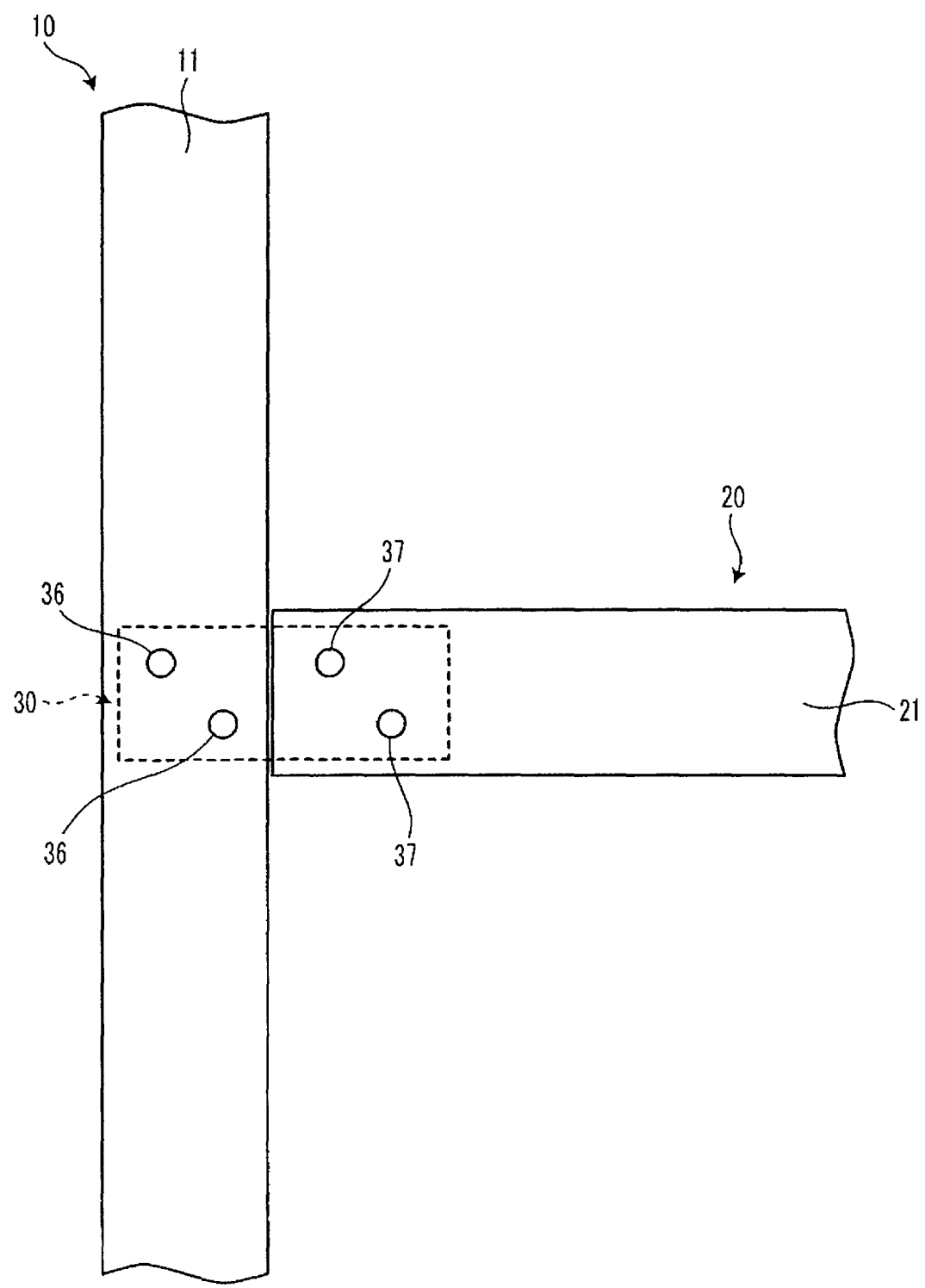
FIG. 7 is an enlarged elevation view of a part surrounded by a broken line of FIG. 2, illustrating a connection part between the first beam and the second beam as viewed from the outside of the housing frame.

A structure of the housing frame according to the present embodiment will be described with reference to FIGS. 3 to 7. FIG. 3 is a perspective view of a first beam constituting the housing frame. FIG. 4 is a perspective view of a second beam constituting the housing frame. FIG. 5 is a perspective view of a connection member constituting the housing frame. FIG. 6 is an enlarged perspective view of a part surrounded by a broken line of FIG. 2, illustrating a connection part between the first beam and the second beam as viewed from the inside of the housing frame. FIG. 7 is an enlarged elevation view of a part surrounded by a broken line of FIG. 2, illustrating a connection part between the first beam and the second beam as viewed from the outside of the housing frame.

The housing frame 1 is constituted by a plurality of vertical beams 10 and a plurality of horizontal beams 20 which are connected to each other. Each of the plurality of beams 10, 20 is formed by perpendicularly bending an elongated rectangular metal plate twice in the longitudinal direction.

The connection structure between the plurality of beams 10 and 20 will be described, taking a part surrounded by a broken line of FIG. 2 as an example. The connection structure includes a vertical beam (referred to as "first beam") 10 and a horizontal beam (referred to as "second beam") 20, a connection member 30, and fastening members 36, 37, and 38.

The first beam 10, which is formed by perpendicularly bending a metal plate twice in the longitudinal direction, includes a flat first base portion 11 and two mutually opposing flat first side portions 12a and 12b. The two first side portions 12a and 12b face each other in parallel. A cut portion 13 is formed in the intermediate part of the first side portion 12a. Fastening holes 14 are formed at a part near the cut portion 13 in the first base portion 11. Further, although not illustrated, rivet holes or bolt holes for rivet fixing or bolt fixing of a panel 52 are formed in predetermined positions of the first beam 10.

To form the first beam 10, first the cut portion 13 and rivet holes are formed in predetermined positions of a metal plate and then the metal plate is bent twice.

Like the first beam 10, the second beam 20 includes a flat second base portion 21 and two mutually opposing flat second side portions 22a and 22b. The two second side portions 22a and 22b face each other in parallel. Fastening holes 24 are formed at the end parts of the second base portion 21 and the second side portions 22a and 22b. Further, although not illustrated, rivet holes or bolt holes for rivet fixing or bolt fixing of a panel 52 are formed in predetermined positions of the second beam 20.

To form the second beam 20, first the rivet holes are formed in predetermined positions of a metal plate and then the metal plate is bent twice.

The connection member 30, which is formed by perpendicularly bending a metal plate twice in the longitudinal direction, includes a flat connection base portion 31 and two mutually opposing flat connection side portions 32a and 32b. The two connection side portions 32a and 32b face each other. The distance between the outer surfaces of the two connection side portions 32a and 32b is substantially equal to the distance between the inner surfaces of the two second side portions 22a and 22b. A plurality of fastening holes 34 are formed in the connection base portion 31 and connection side portions 32a and 32b at positions corresponding to the fastening holes 14 of the first beam 10 and the fastening holes 24 of the second beam 20.

The second beam 20 is arranged perpendicular to the vertically arranged first beam 10 in such a manner that one end of the second beam 20 faces the cut portion 13 of the first side portion 12a (that is, the second beam 20 is horizontally arranged). In this state, a bent side surface 26 of the second base portion 21 faces the same direction as a bent side surface 16 of the first base portion 11 and is disposed on the same plane as the bent side surface 16 of the first base portion 11. "The bent side surface 16 of the first base portion 11" indicates the surface of the first base portion 11 on the side toward which the first side portions 12a and 12b are bent. Similarly, "the bent side surface 26 of the second base portion 21" indicates the surface of the second base portion 21 on the side toward which the second side portions 22a and 22b are bent.

The connection member 30 is arranged so as to extend from one end part of the second beam to the intermediate part of the first beam through the cut portion 13. In this state, the connection base portion 31 extends from the bent side surface 26 of the second base portion 21 to the bent side surface 16 of the first base portion 11 and overlaps with the first base portion 11 and the second base portion 16.

The connection base portion 31 and the first base portion 11 are fastened to each other by the first fastening members 36 inserted through the fastening holes 34 of the connection base portion 31 and the fastening holes 14 of the first base portion 11. The connection base portion 31 and the second base portion 21 are fastened to each other by the second fastening members 37 inserted through the fastening holes 34 of the connection base portion 31 and the fastening holes 24 of the second base portion 24. Further, the connection side portions 32a, 32b and the second side portions 22a, 22b are connected to each other by the third fastening members 38 inserted through the fastening holes 34 of the connection side portions 32a, 32b and the fastening holes 24 of the second side portions 22a, 22b. That is, the first beam 10 and the second beam 20 are connected to each other through the connection member 30. The first fastening member 36, the second fastening member 37, and the third fastening member 38 are each, e.g., a rivet.

Advantages provided by the housing frame of the present embodiment will be described.

As described above, the equal angle steel used to constitute the conventional housing frame is obtained from a hot strip mill or cold strip mill and is standardized in terms of the dimension, shape, and the like. Thus, in order to obtain a housing frame having an arbitrary dimension and shape, large amount of cost and effort are required. On the other hand, according to the housing frame 1 of the present embodiment, the use of a beam obtained by bending a metal plate allows a housing frame 1 having an arbitrary dimension and shape to be easily obtained. Further, a design drawing of the conventional housing frame can be employed without modification for the housing frame 1 of the present embodiment, and replacement of the conventional housing frame with the housing frame 1 of the present embodiment can be easily achieved.

Further, in the case of the conventional housing frame, the beams are connected to each other by welding, so that higher level of skill is required for an operator and a considerable amount of time is required for the work. On the other hand, in the case of the housing frame 1 of the present embodiment, the first beam 10 and the second beam 20 are connected by using the fastening members 30. This does not require higher level of skill for an operator and allows the housing frame 1 to be easily produced with high dimension accuracy, thereby reducing operation time. As a result, the manufacturability about the housing frame 1 can be improved.

Figure 11:
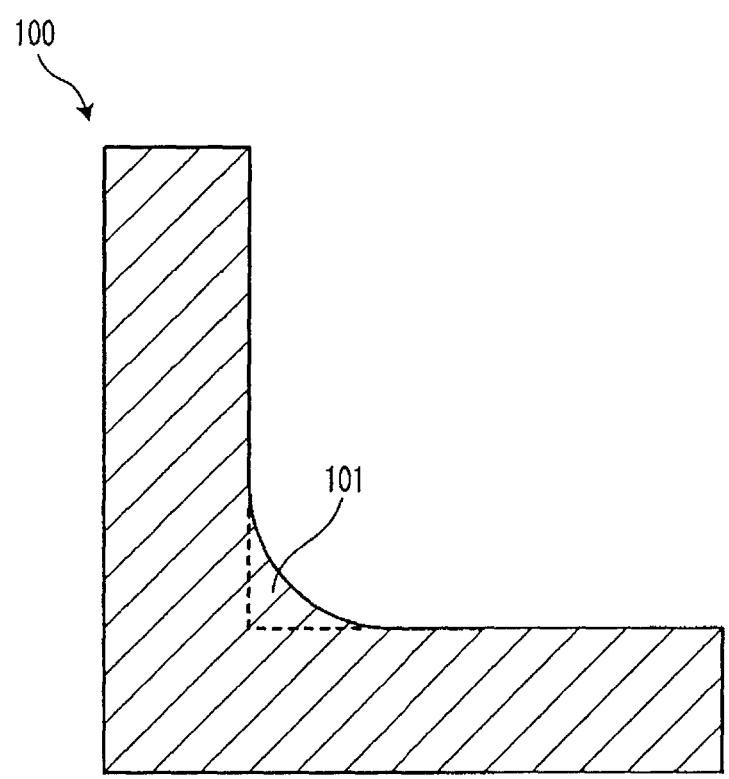
FIG. 11 is a cross-sectional side view of an equal angle steel constituting a conventional housing frame.

Further, an equal angle steel 100 used to constitute the conventional housing frame is standardized and a thick portion 101 is formed inside the corner part as shown in FIG. 11. Therefore, in the case where the equal angle steels 100 are connected using the connection member 30 as in the first embodiment, the connection member 30 and the fastening members 36, 37, 38 are arranged avoiding the thick portion 101. On the other hand, the beam bodies 10, 20 used to constitute the housing frame 1 of the present embodiment is obtained by bending a metal plate, so that the thick portion 101 as described above is not formed, thereby increasing design flexibility.

Second Embodiment

Figure 8:
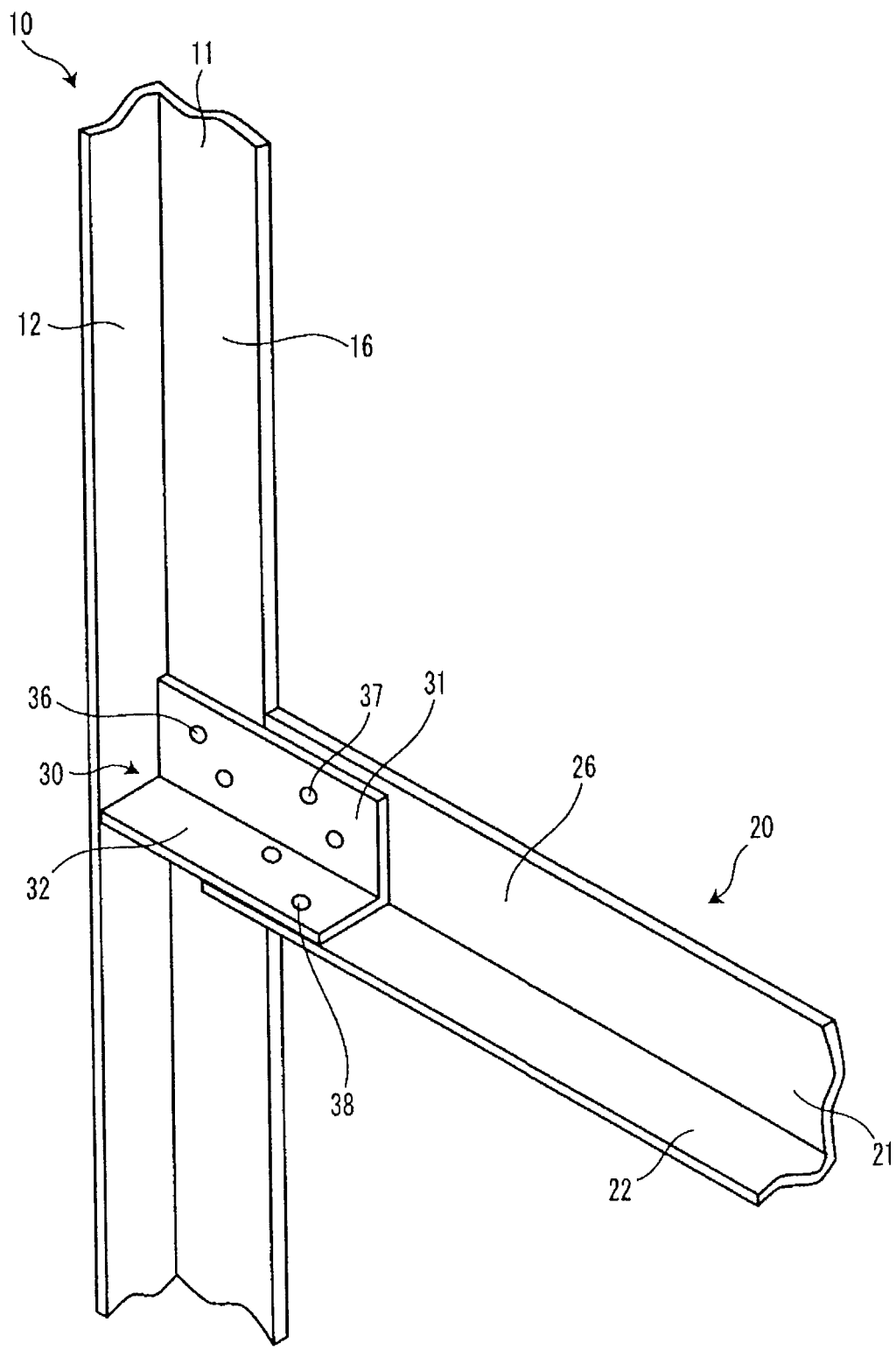
FIG. 8 is a perspective view for explaining a housing frame of an electrical apparatus according to a second embodiment of the present invention, illustrating a connection portion between a first beam and a second beam as viewed from the inside of the housing frame.

A housing frame of an electrical apparatus according to a second embodiment of the present invention will be described with reference to FIG. 8. FIG. 8 is a perspective view of a connection member constituting a housing frame. The present embodiment is a modification of the first embodiment, so that the same reference numerals are given to the same components, and the descriptions thereof will be omitted.

The housing frame 1 is constituted by a plurality of vertical beams and a plurality of horizontal beams 10, 20 which are connected to each other. Each of the plurality of beams 10, is formed by perpendicularly bending a rectangular metal plate once in the longitudinal direction.

A first beam 10, which is formed by perpendicularly bending a metal plate once in the longitudinal direction. The first beam includes a first base portion 11 and a first side portion 12. Similarly, a second beam 20 includes a second base portion 21 and a second side portion 22. The first beam 10 and the second beam 20 each has an L-shaped cross section.

Further, the connection member 30, which is formed by perpendicularly bending a metal plate once in the longitudinal direction, forms an L-shaped cross section. The connection member 30 includes a connection base portion 31 and a connection side portion 32.

According to the present embodiment, the same advantages as in the first embodiment can be obtained.

Third Embodiment

Figure 9:
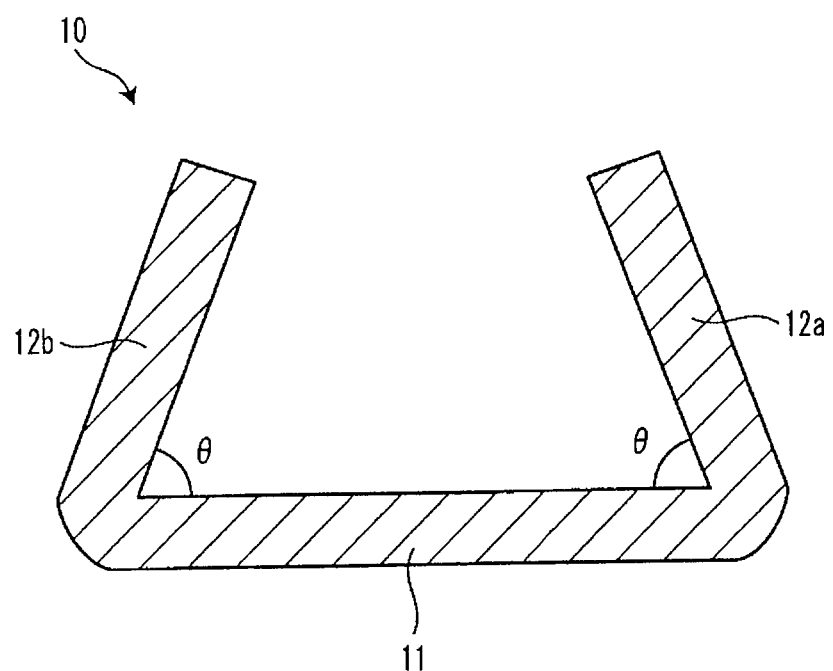
FIG. 9 is a cross-sectional side view of the first beam constituting a housing frame of an electrical apparatus according to a third embodiment of the present invention.
Figure 10:
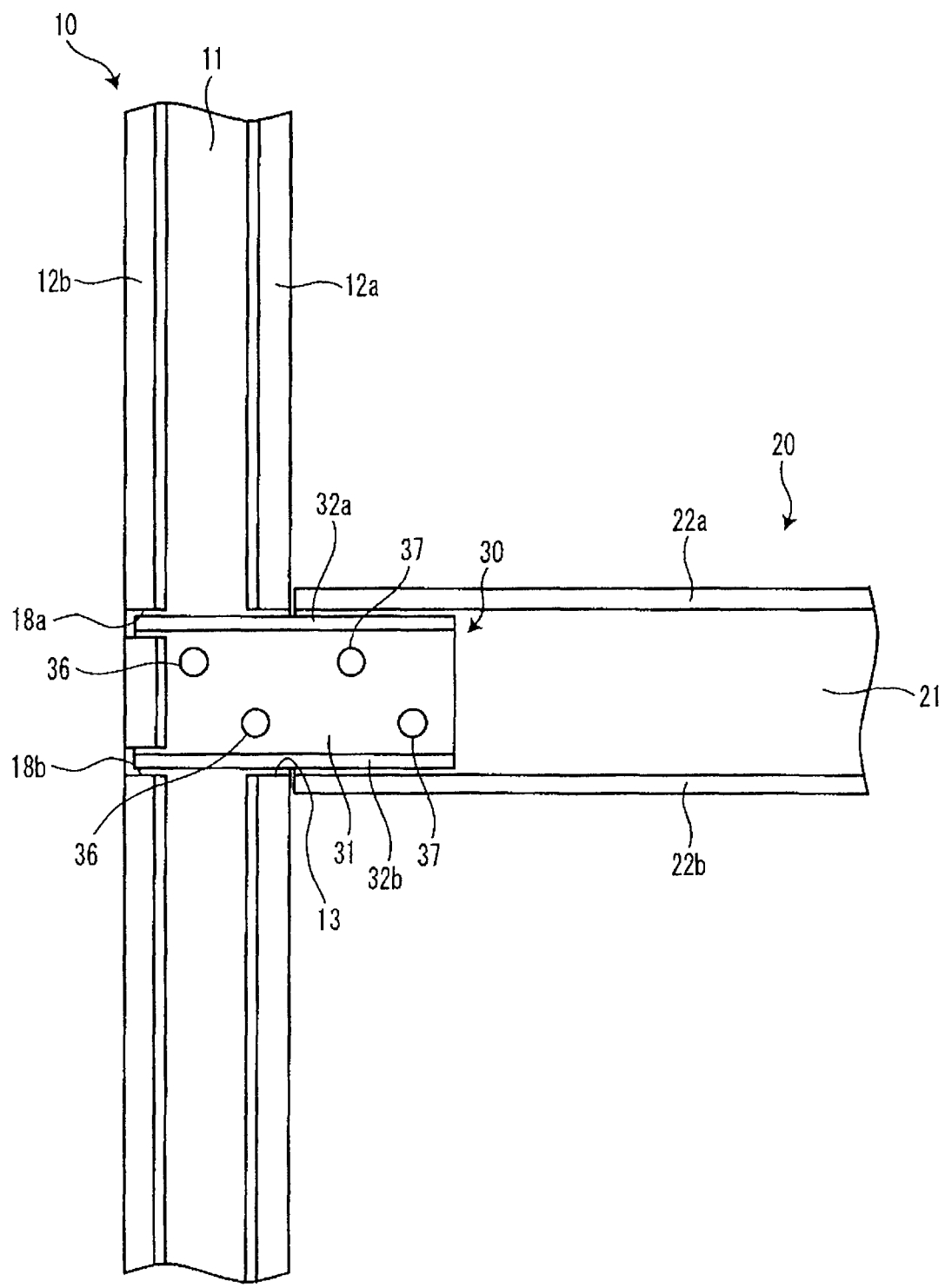
FIG. 10 is an elevation view for explaining the housing frame of the electrical apparatus according to the third embodiment of the present invention, illustrating the connection portion between a first beam and a second beam as viewed from the inside of the housing frame.

A housing frame of an electrical apparatus according to a third embodiment of the present invention will be described with reference to FIGS. 9 and 10. FIG. 9 is a cross-sectional side view of a first beam constituting the housing frame. FIG. 10 is an elevation view for explaining the housing frame, illustrating a connection portion between a first beam and a second beam as viewed from the inside of the housing frame. The present embodiment is a modification of the first embodiment, so that the same reference numerals are given to the same components, and the descriptions thereof will be omitted.

In the present embodiment, a first beam 10 is formed such that an angle θ between a first base portion 11 and each of a first side portions 12a and 12b is an acute angle (e.g., 75°), as illustrated in FIG. 9.

As illustrated in FIG. 10, two slits 18a and 18b are formed in the first side portion 12b. In a state where the first beam 10 and the second beam 20 are connected to each other, one each end part of two connection side portions 32a and 32b each of a connection member 30 is inserted into the respective slit 18a or 18b.

According to the present embodiment, the stiffness of the first beam 10 is increased as compared to the first embodiment, resulting in an increase in the strength of the housing frame.

Other Embodiments

The first fastening member 36, the second fastening member 37, and the third fastening member 38 used in the first embodiment are not limited to the rivets but may be bolts and nuts. Further, one housing frame 1 may be formed by using both the beams according to the first embodiment and those of the second embodiment.

Although only the first beam 10 is formed such that the angle θ between the first base portion 11 and each of the first side portions 12a and 12b is an acute angle in the third embodiment, the second beam 20 and the connection member 30 may also be formed such that the angle θ between the second base portion 21 and each of the second side portions 22a and 22b and the angle θ between the connection base portion 31 and each of the connection side portions 32a and 32b are acute angles.

Further, although the angle θ between the first base portion 11 and the first side portion 12a and the angle θ between the first base portion 11 and first side portion 12b are equal to each other in the third embodiment, they may be different from each other. For example, the following setting may be made: the angle θ between the first base portion 11 and the first side portion 12a is 75° and the angle θ between the first base portion 11 and first side portion 12b is 90°. In this case, the slits 18a and 18b need not be formed.

What is claimed is:

1. A housing frame of an electrical apparatus having two or more beams connected to each other, wherein
    each of the two or more beams includes a rectangular metal plate bent in a longitudinal direction so as to include a flat base portion and two flat side portions, the beams including:
    a first beam including rectangular metal plate bent twice in a longitudinal direction so as to include a flat first base portion and two mutually opposing flat first side portions adjacent to the first base portion, a cut portion being formed at a mid portion of only one of the flat first side portions; and
    a second beam including rectangular metal plate bent twice in a longitudinal direction so as to include a flat second base portion and two mutually opposing flat second side portions adjacent to the second base portion, the second beam being arranged perpendicular to the first beam in such a manner that an inner bent side surface of the second base portion faces a same direction as an inner bent side surface of the first base portion and is disposed on a same plane as the inner bent side surface of the first base portion;
    the housing frame further comprising:
    a connection member having a flat connection base portion extending from the inner bent side surface of the second base portion to the inner bent side surface of the first base portion through the cut portion formed in the one of the first side portions and overlapping with the first base portion and the second base portion;
    a first fastening member inserted through the connection base portion and the first base portion to fasten the connection base portion and the first base portion together; and
    a second fastening member inserted through the connection base portion and the second base portion to fasten the connection base portion and the second base portion together, wherein
    a mid portion of the first beam and an end portion of the second beam are connected in a T-shape by the connection member with the first and second fastening members, and
    angles between the first base portions and the first side portions or angles between the second base portions and the second side portions are acute angles.

2. The housing frame according to claim 1, wherein the connection member includes a metal plate bent so as to include a flat connection side portion.

3. The housing frame according to claim 2, further comprising third fastening members each inserted through one of the second side portions and its opposing one of the connection side portions to fasten the second side portions and the connection side portions together.

4. The housing frame according to claim 3, wherein the first fastening member, the second fastening member, and the third fastening member are rivets.

5. The housing frame according to claim 3, wherein the first fastening member, the second fastening member, and the third fastening member are sets of bolts and nuts.

* * * * *